United States Patent [19]
Kawamura

[11] Patent Number: 6,099,918
[45] Date of Patent: Aug. 8, 2000

[54] METHOD OF PREPARING A POLY-CRYSTALLINE SILICON FILM

[75] Inventor: Shinichi Kawamura, Saitama-ken, Japan

[73] Assignee: Kabushiki Kaisha Toshiba, Kawasaki, Japan

[21] Appl. No.: 09/152,256

[22] Filed: Sep. 14, 1998

[30] Foreign Application Priority Data

Sep. 25, 1997 [JP] Japan ................................. 9-260303

[51] Int. Cl.[7] .................................................. C23C 16/24
[52] U.S. Cl. ........................ 427/554; 427/578; 427/397.7; 427/255.5
[58] Field of Search .................... 427/554, 578, 427/397.7, 255.5

[56] References Cited

U.S. PATENT DOCUMENTS 5,766,344  6/1998  Zhang et al. ............................ 117/103

FOREIGN PATENT DOCUMENTS 07221035  8/1995  Japan .
10116795  5/1998  Japan .

*Primary Examiner*—Timothy Meeks
*Attorney, Agent, or Firm*—Pillsbury Madison & Sutro LLP

[57] ABSTRACT

A method of preparing a poly-crystalline silicon (p-Si) film is provided with efficient dehydrogenation treatment of an amorphous silicon (a-Si) film deposited by a plasma enhanced chemical deposition (PECVD) process. A substrate is received in a process chamber of a PECVD system. A plasma discharge takes place to deposit an a-Si film on the substrate in an atmosphere in which reactive and carrier gases are supplied to the chamber. The substrate is still left in the chamber to carry out dehydrogenation of the a-Si film after the same is deposited on the substrate. While the carrier gas is supplied to the chamber during the leaving period of time, the pressure of the chamber is set higher than during the deposition step. After the dehydrogenation treatment, the substrate is taken out from the chamber. XeCl excimer laser beams are then irradiated to the a-Si film to change it into a p-Si film.

9 Claims, 3 Drawing Sheets

METHOD OF PREPARING A POLY-CRYSTALLINE SILICON FILM

BACKGROUND OF THE INVENTION

FIELD OF THE INVENTION

This invention relates to a method of preparing a poly-crystalline silicon film and, more particularly, a method of preparing a poly-crystalline silicon film characterized in dehydrogenation treatment of an amorphous silicon to be deposited by a plasma chemical vapor deposition process.

Amorphous silicon thin film transistors (a-Si TFTS) have been used for conventional liquid crystal display devices as pixel switching elements. The a-Si TFT includes an active layer made of the a-Si film. This is because the a-Si film can be uniformly deposited at a relatively lower temperature on a glass substrate by a plasma enhanced chemical vapor deposition (PECVD) process. The glass substrate (lower heat-resistance) is suitable for making a display region larger in area.

Driver-circuit integrated type liquid crystal display devices, on the other hand, have been recently developed. In this type liquid crystal display device, driver circuits are disposed at the surrounding of the display region (pixel region) on the same substrate as the pixel switching elements. TFTs are also used for the driver circuits in addition to the switching elements. The TFTs of this sort for the driver circuits requires especially a high-speed response characteristic. Since poly-crystalline silicon (p-Si) films are remarkably higher in mobility than a-Si films, p-Si TFTs with active layers made of p-Si films are used for the driver-circuit integrated type liquid crystal display devices.

The p-Si films are usually formed in the following way. Firstly, an a-Si film is deposited on a glass substrate by a PECVD process. Next, dehydrogenation treatment is carried out for the a-Si film. In the dehydrogenation treatment, the glass substrate with the a-Si film deposited is received in a heating chamber in a low pressure atmosphere and is annealed at a lower temperature (e.g., 400° C. through 500° C.) than a heat-resistance temperature of the glass substrate in order to discharge hydrogen from the a-Si film. Finally, excimar laser beams are irradiated to melt and re-solidify the a-Si film so that the latter is changed into a p-Si film.

Reasons for such dehydrogenation treatment of the a-Si film are as follows. The a-Si film deposited on the substrate by the PECVD method contains a great quantity of hydrogen. When laser beams are irradiated to the a-Si film without the dehydrogenation treatment, hydrogen is discharged so abruptly from it that a phenomenon called "ablation" takes place to make defects in the p-Si film.

Conventionally, a heating chamber or furnace is exclusively and separately provided for the dehydrogenation treatment in addition to a PECVD system. The dehydrogenation treatment in such a heating chamber takes rather long time, e.g., a several hours including heating and cooling time of the glass substrate. Further, the glass substrate with the a-Si film should be washed before dehydrogenation treatment, as the case may be, because the substrate is exposed in the atmosphere after the PECVD process.

Because of the background stated above, the dehydrogenation treatment for the a-Si film in the production process of the p-Si film has been one of the critical factors to hinder its productivity.

SUMMARY OF THE INVENTION

An object of the present invention is to provide efficient dehydrogenation treatment for an a-Si film deposited by a PECVD process in a production of a p-Si film.

In a method of preparing a p-Si film of this invention, a glass substrate is set in a process chamber of a PECVD system. In order to deposit an a-Si film on the substrate, plasma discharge is performed in an atmosphere of reactive and carrier gases in the chamber. When the a-Si film has been deposited on the substrate, the pressure of the chamber is reduced with respect to atmospheric pressure but the substrate is left in the chamber to perform dehydrogenation treatment for the a-Si film. After the completion of the dehydrogenation, the substrate is taken out from the chamber. Laser beams are irradiated to the a-Si film on the substrate so that it is transformed into a p-Si film.

According to the method of preparing the p-Si film of the present invention, after the a-Si film is deposited on the substrate, the dehydrogenation treatment is continuously carried out while the substrate is kept in the reaction chamber. Since the substrate is sufficiently heated when the a-Si film is deposited on the substrate, it is unnecessary to heat the substrate before the dehydrogenation treatment. Cooling treatment for the substrate is conducted only once after the completion of the dehydrogenation. Thus, time required for re-heating and re-cooling treatments in the conventional method can be saved in the case of the method of the present invention. In addition, since the substrate is not exposed in the atmosphere, its washing is not needed before the dehydrogenation treatment. As a result, the total processing time in the method of the present invention can be shortened drastically.

Preferably, after the a-Si film is properly deposited on the substrate in the process chamber of the PECVD system, the substrate is left to carry out the dehydrogenation treatment while the carrier gases are supplied to the chamber. Further, after the a-Si film deposition process, the substrate is kept in the chamber which pressure is set higher than that at the deposition process. Generally, the dehydrogenation treatment is carried out more efficiently as its temperature rises. If the flow of gases remains unchanged with the substrate in the chamber and the pressure of the chamber is set higher than the deposition process, the temperature of the substrate rises rapidly and the hydrogen is discharged from the a-Si film.

In addition, preferably, after the deposition of the a-Si film, the substrate is left in the chamber in which the output power of a heater for the substrate is kept the same as at the deposition process. If, at the changing timing of process from the PECVD to the dehydrogenation, the pressure of the chamber is set higher than at the PECVD process, with the flow of gases unchanged in the chamber, and the output power of the heater is kept fixed, adjustment time for temperature in the chamber to start up the next PECVD process can be shortened.

Further more, preferably, the substrate temperature at the deposition process is set at 400° C. or more. The period of time t (seconds) during which the substrate is left in the chamber is set to satisfy the following equation (1):

$$t > d^2/(A \times \exp B) \tag{1}$$

where $A = 6.0 \times 10^{14}$, $B = -2.56 \times 10^{-19}/(k \times (273+\theta))$, and $k = 1.38 \times 10^{-23}$, where d (angstroms) is the thickness of the a-Si film and θ is the substrate temperature when the substrate is left in the chamber.

The equation (1) is derived from the following theory. The rate of the dehydrogenation is determined by the diffusion of hydrogen in the a-Si film. When the root mean square diffusion length "λ" of hydrogen is greater than the thickness "d" of the a-Si film, the effect of dehydrogenation is brought about. Where the diffusion coefficient is D [cm²/sec] in the a-Si film and the leaving period of time is t [sec], the root mean square diffusion length λ [cm] during the leaving period of time is given by the following:

$$\lambda = (2 \times D \times t)^{+1/2}$$

The above stated condition, i.e., the relationship between the thickness d (angstroms) of the a-Si film and the root mean square diffusion length λ [cm], can be expressed by the following:

$$d < (2 \times D \times t)^{+1/2} \times 10^8$$

From that equation, the leaving period of time required for the efficient dehydrogenation treatment is expressed by the following:

$$t > d^2 / (10^{16} \times 2 \times D) \quad (2)$$

where $$D = DO \times \exp(-Ed/kT)$$

$$Do = 3 \times 10^{-2} [cm^2/sec]$$

$$Ed = 1.6 \times 1.60 \times 10^{-19} [J]$$

Ed: hydrogen diffusion energy (1.6 eV), T: temperature [K] of the a-Si film : and k: Boltzmann's constant (1.38×10⁻²³ J/K).

If these values are inserted into the equation (2), the equation (1) can be obtained. The method of the present invention is, particularly, effectively carried out in a single substrate processing type PECVD system with a small heat capacity.

The above-stated and other objects and technical features of the present invention will become apparent from the following description when taken with the accompanying drawings. It will be understood, however, that the drawings are for purposes of illustration and are not to be construed as defining the scope of the invention, reference being had for the latter purpose to the claims appended hereto.

BRIEF DESCRIPTION OF THE DRAWINGS

FIGS. 1(a) and 1(b) are used to explain a method of preparing a p-Si film of the present invention in which FIG. 1(a) is a sectional view of an a-Si film substrate device and FIG. 1(b) is a p-Si film substrate;

DESCRIPTION OF THE PREFERRED EMBODIMENT

Figure 1A:
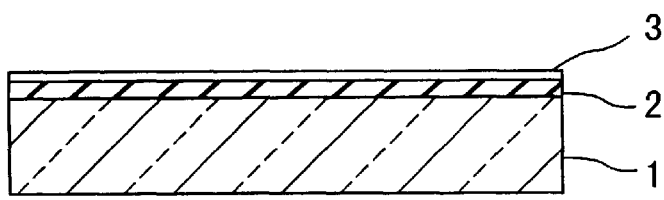

An embodiment of this invention will be explained with reference to FIG. 1. As shown in FIG. 1(a), a silicon oxide layer 2 with 1,000 angstroms is formed on a glass substrate 1 by the PECVD process. A-Si films 3 are deposited on the silicon oxide layer 2 by a single substrate processing type capacitively coupled PECVD system. Its process conditions are the flow ratio $SiH_4/Ar=1/20$, the pressure of the process chamber=1 Torr, the RF output=100 W, the gap between electrodes=25 mm, the temperature of the substrate=420° C., and the deposition rate=700 angstroms/min.

When the thickness of the a-Si film 3 has reached a predetermined value, the RF output is turned off and the supply of $SiH_4$ is stopped. Even after the completion of the PECVD process, the output of a heater is still kept constant. In this situation, the pressure in the chamber is raised up to 4 Torr, the substrate is left therein, and the dehydrogenation of the a-Si film 3 is carried out. After a lapse of a predetermined period of time (to be described latter), the substrate is taken out from the chamber.

Figure 1B:
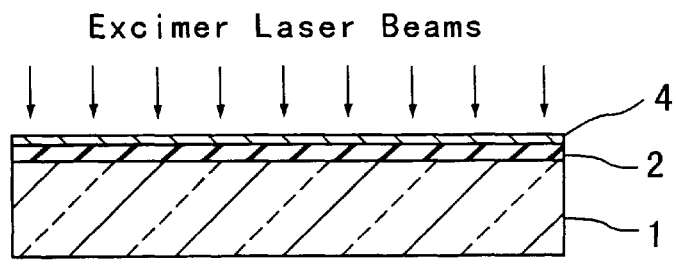

Next, as shown in FIG. 1(b), XeCl excimer laser beams (λ=308 nm: pulsed oscillation) are irradiated to the a-Si film 3 on the substrate 1, the a-Si film is melted and solidified again, and the p-Si film 4 is formed at the end.

Figure 2:
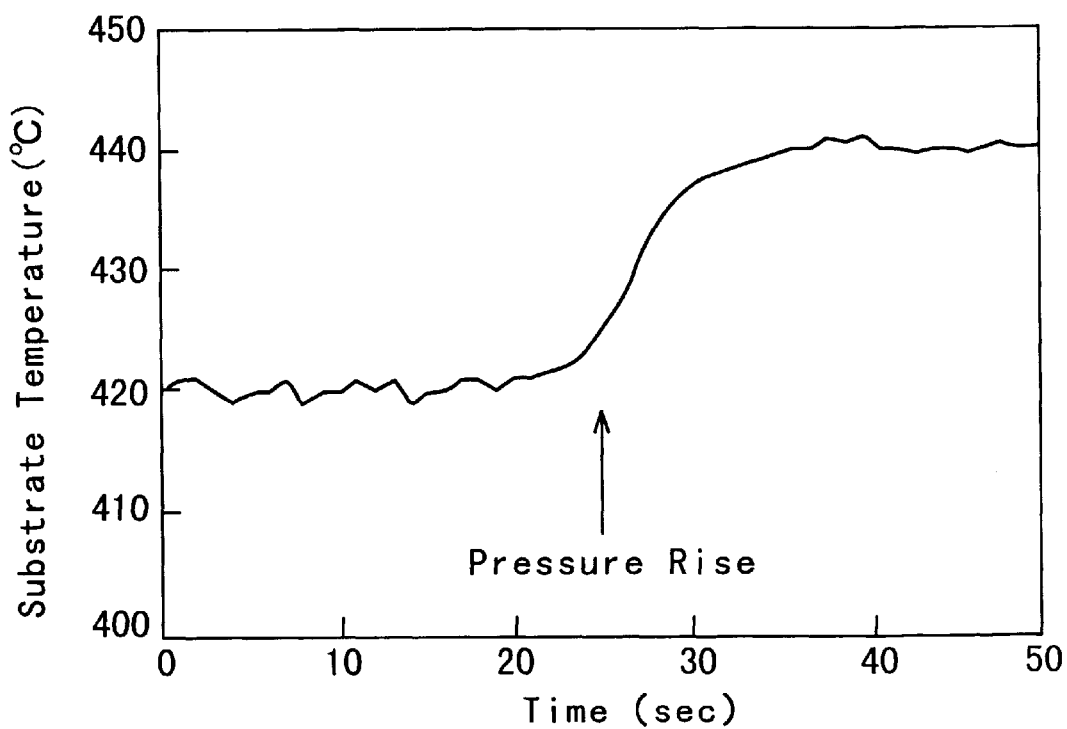
FIG. 2 is a graph to show temperature changes in the substrate in the case that the process transfers from the CVD under the pressure of 1 Torr in the reactive chamber through the dehydrogenation under the pressure of 4 Torr therein.

FIG. 2 shows measured data of temperature changes in the substrate in the case of the transfer from the PECVD process to the dehydrogenation process. As shown in FIG. 2, when the pressure in the chamber rises from 1 Torr ($SiH_4$/Ar are supplied) to 4 Torr (Ar is supplied), the temperature of the substrate varies from about 420° C. to about 440° C.

In order to shorten the leaving period of time after the completion of the PECVD process, it is effective to set the temperature of the substrate high enough to reduce the hydrogen content in the a-Si film, and to make the same high during the leaving period of time. As described above, after the deposition of the a-Si films by the PECVD process, the substrate is left under higher pressure than in the deposition process so that the temperature of the substrate becomes higher than in the deposition process and the hydrogen can be discharged in short time.

The method explained above is particularly effective in the case of a single substrate processing type PECVD system. Since the substrate is treated at one sheet a time, the system heating capacity of the system is small. Thus, when the substrate is left after the deposition of the a-Si films, the temperature in the chamber increases greatly as the pressure is set higher in case that the gas flow is kept substantially constant.

Figure 3:
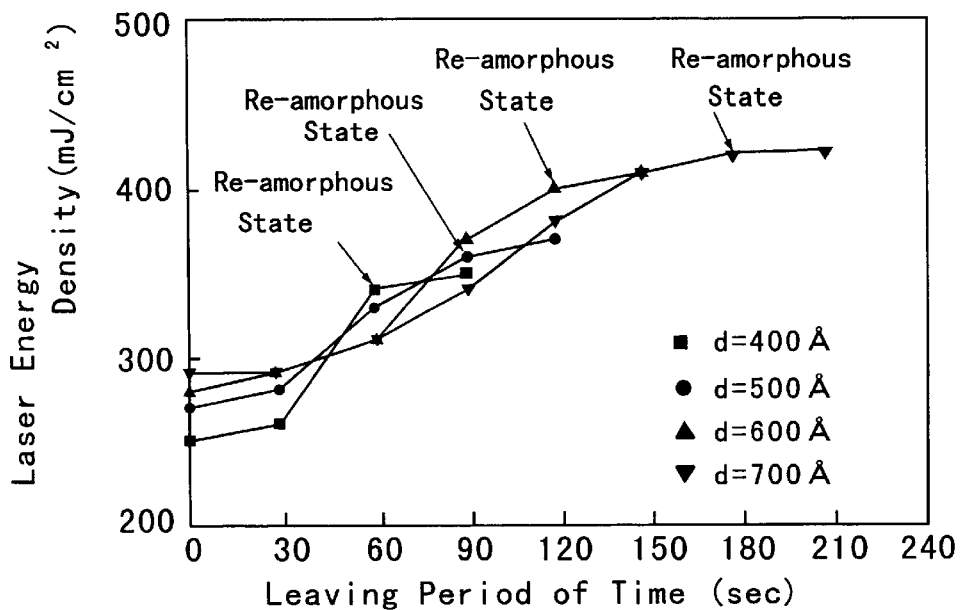
FIG. 3 is a characteristic curve to indicate the relationship between the period of time during which the substrate is left in the chamber after the deposition of a-Si films in the PECVD process and energy densities of excimer laser irradiation at which ablation takes place in the films.

FIG. 3 indicates the relationship between the period of time during which the substrate is left in the chamber after the deposition of a-Si films in the PECVD process and energy densities of excimer laser irradiation at which ablation takes place in the films. The thickness (400–700 angstroms) of the a-Si film is used in FIG. 3 as a parameter.

As apparent from FIG. 3, when the substrate has been left for a couple of minutes after the completion of the PECVD process, the energy density to cause the ablation increases in value every thickness of the films from 400 angstroms through 700 angstroms. That is to say, the tolerance to ablation is improved.

When laser irradiation is carried out for poly-crystallization of an a-Si film, its crystalline grain size usually becomes larger as the energy density of the laser increases. In the case, however, where the energy density becomes too large, re-formation of an a-Si film takes place so that the grain size becomes small. Thus, if the energy density is less than for the re-formation of the a-Si film and no ablation occurs, it can be judged that the tolerance to the laser irradiation is sufficient. FIG. 3 also indicates the energy density for each thickness of the films at which the re-formation of the a-Si film takes place.

Figure 4:
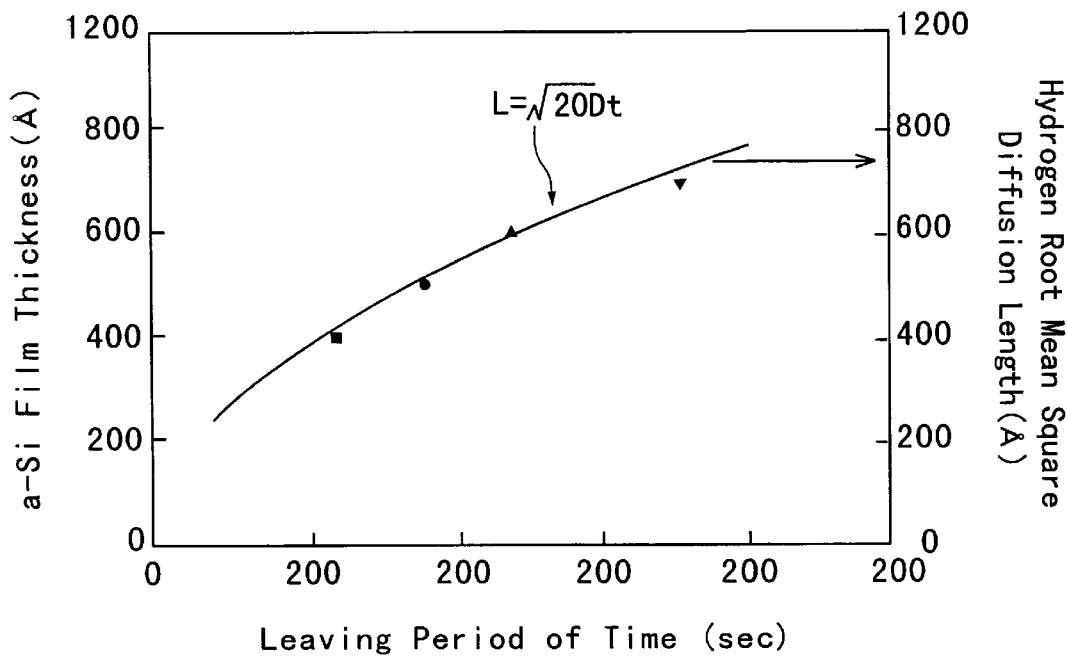
FIG. 4 is a characteristic curve to show the relationship between the period of time t (the horizontal axis) during which the hydrogenation is required for avoidance of ablation at lower energy density than re-formation of an a-Si film and the thickness d (the vertical axis) thereof, and the root mean square diffusion length L of hydrogen in the a-Si film every leaving period of time.

Based upon the data depicted in FIG. 3, FIG. 4 is a characteristic curve to show the relationship between the thickness d (angstroms) of a-Si films and the leaving period of time t (second) required for the hydrogenation with avoidance of ablation at lower energy density than re-formation of the a-Si films.

Where the diffusion coefficient is D [cm$^2$/sec] in the a-Si film and the leaving period of time is t [sec], the root mean square diffusion length λ [cm] during the leaving period of time is given by the following:

$$\lambda = (2D \times t)$$

where

D=D0×exp(-Ed/kT)

Do=3×10$^{-2}$[cm$^2$/sec]

Ed=1.6×1.60×10$^{-19}$[J]

k=1.38×10$^{-23}$[J/K]

Ed: hydrogen diffusion energy (1.6 eV),

T: temperature [K] of the a-Si film, and k: Boltzmann's constant.

Thus, the root mean square diffusion length L (angstroms) of hydrogen is given by the following:

$$L = (A \times t \times \exp B)^{1/2}$$

$$A = 6.0 \times 10^{14}, \text{ and}$$

$$B = -2.56 \times 10^{-19}/(k \times (273+\theta))$$

FIG. 4 also indicates the root mean square diffusion length L (the right axis) with respect to each leaving time t (the X-axis).

It is understood from FIG. 4 that, if the root mean square diffusion length of hydrogen is set larger than the thickness d of the a-Si film during the leaving period of time, no ablation takes place at the less energy density than for the re-formation of the a-Si films and the sufficient tolerance to the laser ablation can be obtained.

In the case where the substrate temperature at the PECVD process is more than 400° C. and the hydrogen content is originally little, the tolerance to the laser irradiation at the poly-crystallization can be secured if the root mean square diffusion length of hydrogen in the a-Si film is set larger than the thickness thereof during the leaving period of time to satisfy the following inequality:

$$(A \times t \times \exp B)^{1/2} > d$$

Thus, the necessary leaving period of time is given by the following:

$$t > d^2/(A \times \exp B) \quad (1)$$

One example of manufacturing processes for a p-Si TFT will be explained hereinbelow with reference with FIG. 5(a) through FIG. 5(g). The p-Si film of the present invention is used for the TFT as an active semiconductor layer.

Figure 5A:
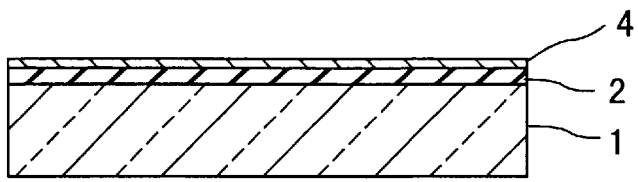
FIGS. 5(a) through 5(g) show cross-sectional views of the substrates in a series of production processes for a TFT for which the p-Si film of the present invention is used.
Figure 5B:
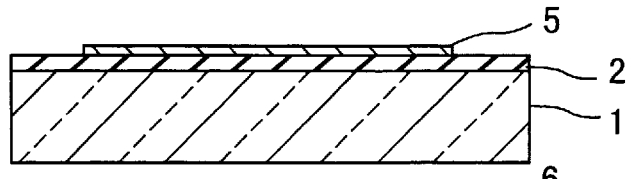

As shown in FIG. 5(a), after a silicon oxide layer 2 and an a-Si layer are deposited on a glass substrate 1, Xe Cl excimer laser beams are irradiated to the a-Si layer so that it is poly-crystallized and eventually a p-Si layer 4 is formed on the silicon oxide layer 2. A photolithography patterning is then applied to make a photoresist pattern on the p-Si layer 4. Further, an etching process of the p-Si layer 4 is carried out to form an island-like p-Si layer 5 as shown in FIG. 5(b).

Figure 5C:
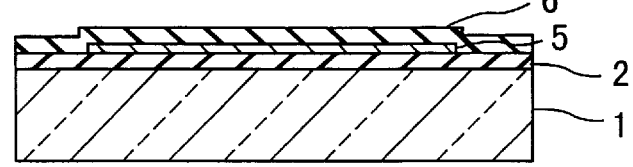

A silicon oxide film 6 is then deposited to be 1,000 angstroms in thickness on the p-Si layer 5 and the silicon oxide layer 2 by the PECVD process, and forms an gate insulation layer as shown in FIG. 5(c).

Figure 5D:
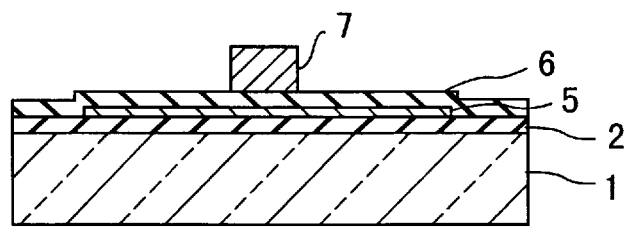

In the next step, an alloy of molybdenum and tantalum is deposited to be 3,000 angstroms in thickness by a sputtering method. As shown in FIG. 5(d), the alloy is processed to form a gate electrode 7 by a patterning method of photolithography.

Figure 5E:
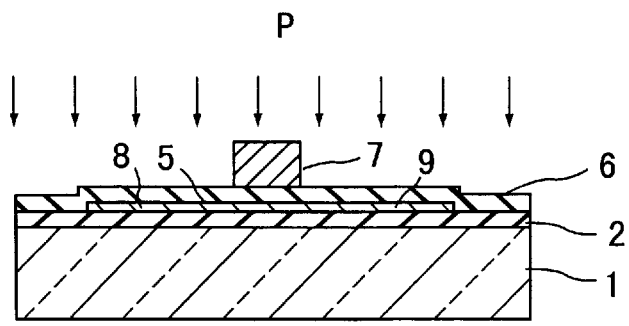

FIG. 5(e) schematically shows an ion implantation. A mass separation-type ion implantation system is used to implant an impurity doping material or a dopant (e.g., phosphorus) into the p-Si film through the silicon oxide film 6 and the gate electrode 7 used as a mask. The doped regions form ohmic contacts 8 and 9. A non-mass separation-type ion implantation system may be used for the same purpose.

Figure 5F:
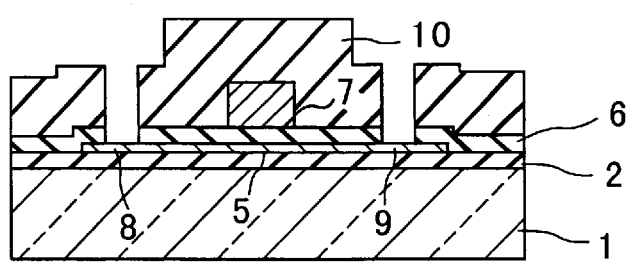
Figure 5G:
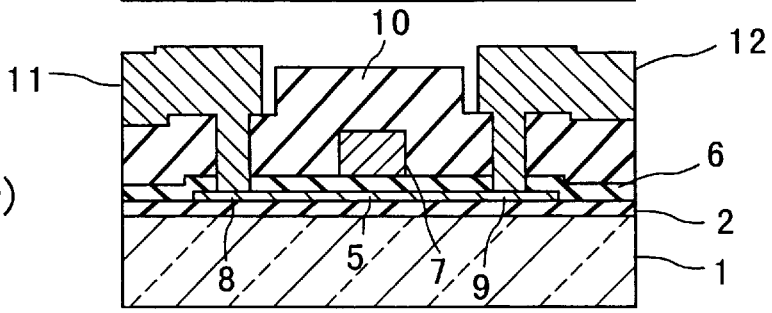

Another silicon oxide film 10 is deposited to forms an inter-layer isolation layer with the thickness of 4,000 angstroms by the PECVD method. Excimer laser beams are irradiated through the isolation layer 10 to activate the dopant. As shown in FIG. 5(f), the isolation layer 10 is, then, processed to define contact holes by a patterning method of photolithography.

An alloy of molybdenum and tantalum is deposited to be 4,000 angstroms in thickness on the upper surface of the device shown in FIG. 5(f) by a sputtering method. The alloy is further processed to form source and drain electrodes 11 and 12 by the patterning method of photolithography. The process sequences described above finally produce the TFT which active semiconductor layer is made of the p-Si film.

According to the method of preparing a p-Si film of the present invention, after the a-Si film is deposited on the substrate by the PECVD process, the substrate is left in the reaction chamber for the short period of time so that the dehydrogenation treatment of the a-Si film can be carried out efficiently. As a result, the sufficient tolerance to the laser beam irradiation in the subsequent poly-crystallization process can be obtained and it provides a significant effect on improvement to the productivity of the p-Si film.

In the event, particularly, that the substrate temperature is set at 400° C. or more in the PECVD deposition process of the a-Si film and the chamber pressure during the leaving period of time is set higher than the deposition process, the period of time required for the dehydrogenation treatment can be shortened.

In the method of preparing a p-Si film of this invention, the period of time for dehydrogenation treatment during which the substrate is left in the process chamber is set to satisfy the equation (1) in which the root mean square diffusion length of hydrogen in the a-Si film is larger during the leaving period of time than the thickness of the a-Si film, the sufficient tolerance to the laser beam irradiation in the poly-crystallization process can be secured.

What I claim is:

1. A method of preparing a poly-crystalline silicon film comprising the steps of:

depositing an amorphous silicon film on a substrate by a plasma chemical vapor deposition process in a reaction chamber while a heater heats a substrate at a temperature of 400° C. or more;

leaving the substrate in the chamber after deposition of said amorphous silicon film, setting the pressure of the chamber higher than a pressure of the chamber during said depositing step and carrying out a dehydrogenation treatment of the amorphous silicon film; and poly-crystallizing the amorphous silicon film after said dehydrogenation treatment.

2. The method of preparing a poly-crystalline silicon film according to claim 1, wherein the period of time t (seconds) during which the substrate is kept in the chamber for said dehydrogenation treatment, the thickness d (angstroms) of the amorphous silicon film, and the temperature θ (° C.) of the chamber at the time when the substrate is left in the chamber satisfy the following equation (1);

$$t > d^2/(A \times \exp B)$$

where $$A = 6.0 \times 10^{14},$$

$$B = -2.56 \times 10^{-19}/(k \times (273+\theta)), \text{ and}$$

$$k = 1.38 \times 10^{-23}.$$

3. The method of preparing a poly-crystalline silicon film according to claim 1, wherein said depositing step is carried out with reactive and carrier gases supplied to the chamber and the dehydrogenation treatment step is carried out with the carrier gas supplied to the chamber.

4. The method of preparing a poly-crystalline silicon film according to claim 3, wherein said dehydrogenation treatment is carried out in a situation that the reactive gas is not supplied to the chamber.

5. The method of preparing a poly-crystalline silicon film according to claim 1, wherein said poly-crystallizing step is carried out by irradiation of said amorphous silicon film with energy beams.

6. The method of preparing a poly-crystalline silicon film according to claim 5, wherein the energy beams are excimer laser beams.

7. The met of preparing a poly-crystalline silicon film according to claim 1, wherein said depositing step is carried out by making use of a single substrate processing plasma chemical vapor deposition system.

8. The method of preparing a poly-crystalline silicon film according to claim 1, wherein the density of hydrogen in the amorphous silicon film is less than 10%.

9. The method of claim 1, wherein the depositing step is carried out by making use of a capacitively coupled plasma chemical vapor deposition system.

\* \* \* \* \*